(12) United States Patent
Turner

(10) Patent No.: US 6,876,572 B2
(45) Date of Patent: Apr. 5, 2005

(54) PROGRAMMABLE LOGIC DEVICES WITH STABILIZED CONFIGURATION CELLS FOR REDUCED SOFT ERROR RATES

(75) Inventor: John E. Turner, Santa Cruz, CA (US)

(73) Assignee: Altera Corporation, San Jose, CA (US)

(*) Notice: Subject to any disclaimer, the term of this patent is extended or adjusted under 35 U.S.C. 154(b) by 20 days.

(21) Appl. No.: 10/443,179

(22) Filed: May 21, 2003

(65) Prior Publication Data

US 2004/0233701 A1 Nov. 25, 2004

(51) Int. Cl.$^7$ ................................................ G11C 11/00
(52) U.S. Cl. .................... 365/156; 365/154; 365/189.05
(58) Field of Search ................................ 365/156, 154, 365/189.05, 230.08; 257/298

(56) References Cited

U.S. PATENT DOCUMENTS

| | | | |
|---|---|---|---|
| 4,513,167 A | 4/1985 | Brandstetter | ................. 136/244 |
| 5,739,564 A * | 4/1998 | Kosa et al. | .................. 257/298 |
| 6,259,643 B1 * | 7/2001 | Li | ................................ 365/206 |
| 6,368,514 B1 | 4/2002 | Metzler | ......................... 216/6 |
| 2003/0038303 A1 | 2/2003 | Hashimoto et al. | ......... 257/396 |

FOREIGN PATENT DOCUMENTS

EP  0357980 A2  3/1990

* cited by examiner

Primary Examiner—Anh Phung
Assistant Examiner—Pho M. Luu
(74) Attorney, Agent, or Firm—Fish & Neave IP Group; Robert R. Jackson

(57) ABSTRACT

Programmable logic devices are provided having configuration memory cells that exhibit decreased soft error rates. A stabilizing capacitor may be connected between each of the memory cell's input and output terminals. The capacitor may be a metal-insulator-metal capacitor formed using a vertical structure, a horizontal structure, or a hybrid vertical-horizontal structure. The memory cell may have inverter transistors of increased strength to help stabilize the memory cell.

22 Claims, 11 Drawing Sheets

PROGRAMMABLE LOGIC DEVICES WITH STABILIZED CONFIGURATION CELLS FOR REDUCED SOFT ERROR RATES

BACKGROUND OF THE INVENTION

This application relates to integrated circuits such as programmable logic array integrated circuits ("programmable logic devices"), and more particularly, to ways in which to stabilize configuration memory cells in programmable logic devices to reduce soft error rates.

Programmable logic devices are integrated circuit devices in which logic can be customized by a user. A customized programmable logic device may be used to perform customized logic functions when the device is operated in a system.

To customize a programmable logic device, the device is loaded with configuration information (called "programming data"). The programming data may be stored in a flash memory chip, disk drive, or other storage device in the system. Upon power-up, the programming data may be loaded from the flash memory chip or other storage device into configuration random-access memory (CRAM) cells on the programmable logic device. The output of each CRAM cell is either a logic high signal or a logic low signal, depending on the value of the programming data bit stored within the CRAM cell. The output signal from each CRAM cell may be used to control a corresponding circuit element. The circuit element may be, for example, a pass transistor, a transistor in a logic component such as a multiplexer or demultiplexer, a transistor in a look-up table, or a transistor or other programmable circuit element in any suitable configurable logic circuit.

When the gate of an n-channel metal-oxide-semiconductor (NMOS) transistor that is controlled by a CRAM cell is taken high (because the CRAM cell contains a logic "one"), the transistor is turned on so that signals can pass between its drain and source terminals. When the gate of the transistor is taken low (because the CRAM cell contains a logic "zero"), the transistor is turned off. In this way, the transistors on the programmable logic device and therefore the functionality of the logic on the programmable logic device can be configured.

Programmable logic devices are used in many sensitive applications in the areas of telecommunications, system control, etc. In such environments, programmable logic devices are generally expected to operate for many years without fail. It is therefore important that the CRAM cells in a programmable logic device be able to store programming data for long periods of time without exhibiting any unexpected changes.

Programmable logic devices often use metal-oxide-semiconductor (MOS) technology. Such programmable logic devices have metal-oxide-semiconductor field-effect transistors (MOSFETs). When radiation such as alpha particle radiation or cosmic ray radiation strikes a MOS transistor, charge is collected on the transistor's terminals. This can lead to a voltage change on the terminals. If an excessive voltage change is produced on one of the terminals of the transistor in a CRAM cell, the value of the bit stored in that CRAM cell can be changed. These so-called soft errors can drastically affect the operation of a programmable logic device and must therefore be avoided for stable device operation.

The impact of soft errors on the operation of a programmable logic device may be reduced by adding additional transistors to the CRAM cell to make it more robust. However, adding transistors to the CRAM cell can add substantial real estate to the CRAM cell. This is undesirable, because it increases the die area required to implement a given programmable logic device design, which makes the device more costly.

The impact of soft errors can also be reduced by adding an isolation well below each transistor structure, but this tends to increase the cost and complexity of the device.

Another way to reduce the impact of soft errors is to use error correction techniques. With this approach, the CRAM cells on a programmable logic device may be reprogrammed whenever an error is detected. Although this approach does not require an increase in CRAM cell real estate, there is a non-zero amount of time during which the device cannot be used during each reprogramming event. To minimize disruption to the operation of the system, the frequency with which the device must be reprogrammed to correct errors should be minimized.

Improved techniques for reducing the soft error rate of integrated circuits such as programmable logic devices are therefore needed.

SUMMARY OF THE INVENTION

In accordance with the present invention, integrated circuits are provided that have improved soft error rate performance. The integrated circuits may be used in data processing systems to reduce the impact of errors on such systems.

The integrated circuits may be programmable logic devices or other integrated circuit devices containing storage cells. The storage cells may be based on a cross-coupled inverter design having metal-oxide-semiconductor (MOS) transistors. The storage cells may be stabilized by adding one or more capacitors to each cell. The cells may also be stabilized by increasing the strength of the transistors. The impact of soft errors may be further reduced by using isolation wells, error correction techniques, robust cell designs, and other such approaches.

A stabilization capacitor may be provided between the respective output terminals of the cross-coupled inverters (i.e., between the input and output terminals of the storage cell), because this location is particularly efficient at stabilizing the cell for a given added capacitance value.

The added capacitors may be formed using a metal-insulator-metal arrangement. Capacitors may be vertical (having electrodes at different heights above the surface of the programmable logic device substrate) or horizontal (having electrodes in a plane parallel to the substrate surface) or may be formed using a combination of vertical and horizontal structures.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
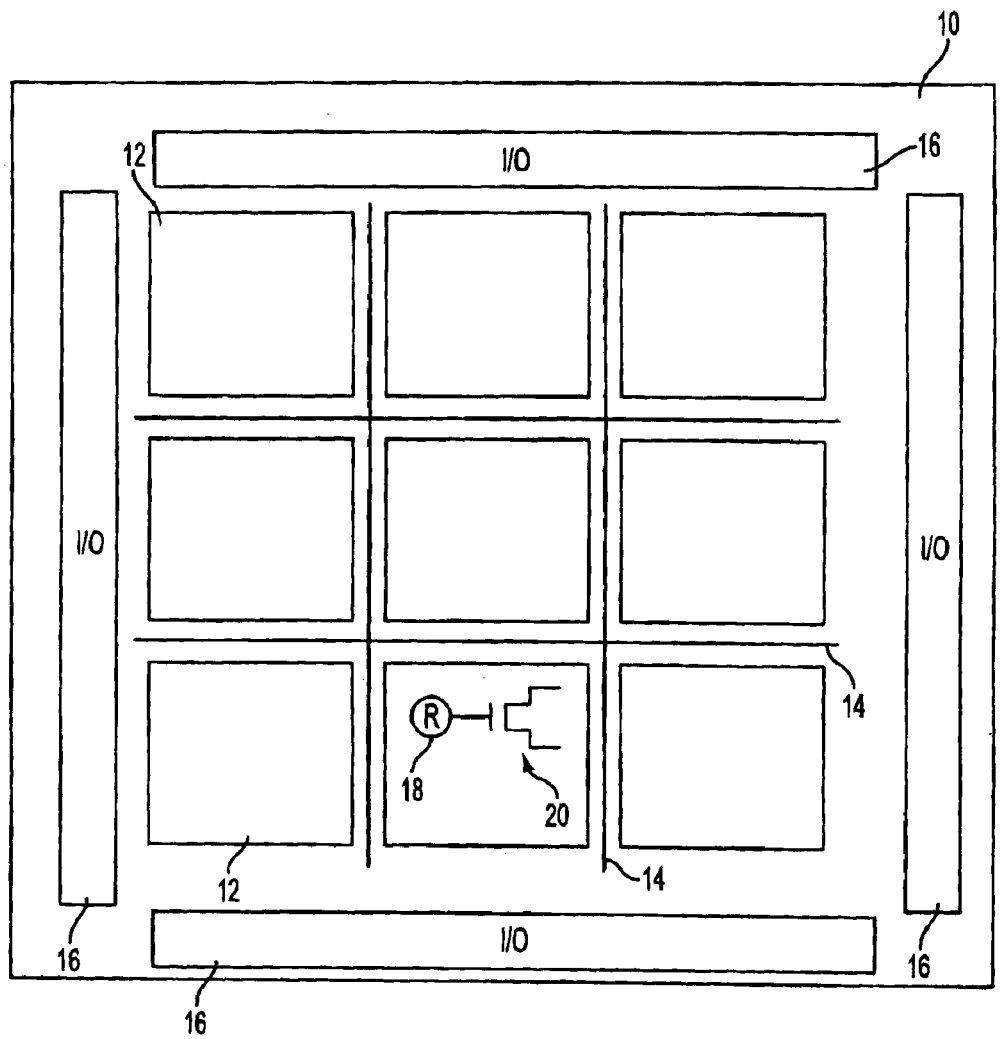
FIG. 1 is a diagram of an illustrative programmable logic device integrated circuit having circuitry that enhances the stability of the device in accordance with the present invention.

An illustrative programmable logic device 10 in accordance with the present invention is shown in FIG. 1. The present invention is also applicable to other integrated circuits having memory cells (e.g., memory chips). For clarity, the present invention is described primarily in the context of integrated circuits such as programmable logic devices.

Device 10 may have a number of rows and columns of regions 12 of programmable logic. Regions 12 may be disposed on device 10 in a two-dimensional array of, for example, 5–300 rows and 5–300 columns of regions 12 or any other suitably-sized array.

The logic in regions 12 may be interconnected using interconnection resources such as vertical and horizontal conductors 14. Such conductors may, for example, include relatively large inter-region conductors that extend past all or some of the logic regions 12 in a row or column. There may be any suitable number of conductors 14. For example, there may be about 10–30 conductors 14 in each row and each column of regions 12. Programmable logic may be used to selectively connect all or a subset of the conductors 14 in each row or column to the associated logic regions 12 in that column. If desired, programmable logic may also be used to directly interconnect the vertical and horizontal conductors 14. The conductors 14 may be continuous or segmented and, if segmented, may be programmably connected to serve as continuous conductors.

Input-output circuitry 16 may be used to interconnect the logic of device 10 to external components (e.g., through I/O pads connected to pins in a package). Additional circuitry may also be used such as circuitry for programming and testing device 10. To avoid over-complicating the drawing, details of the programmable logic interconnections and programming and testing circuitry of device 10 are not shown in FIG. 1. Moreover, the arrangement of FIG. 1 is merely illustrative. Any suitable programmable logic device architecture may be used for device 10 if desired.

Programmable logic device 10 may be shipped to a customer ("user") in a substantially unprogrammed condition. The customer may use equipment (referred to as a device "programmer") to program or configure the device 10 so that device 10 performs a desired custom logic function. Sometimes two or more conductors must be selectively connected to a third conductor. This type of function may be performed using switches that are controlled by storage elements containing the programming data. The switches may be pass transistors (e.g., pass transistors that selectively connect respective interconnection resources) or may be transistors in other programmable logic components such as transistors in multiplexers, demultiplexers, look-up tables, etc. These various programmable components may sometimes be referred to as programmable logic connectors ("PLCs"). An illustrative transistor 20 that may form all or part of a programmable logic connector component is shown in FIG. 1.

Programmable logic connectors and other components on device 10 are typically controlled by programmable function control elements ("FCEs"). A programmable function control element may, for example, be based on a programmable memory cell. Memory cells that are loaded with programming data (configuration data) using data and address lines may sometimes be referred to as configuration random-access memory (CRAM) cells. Memory cells are designated by the letter "R" in some of the drawings. For example, in FIG. 1, a memory cell 18 is represented with an "R."

The memory cells and corresponding programmable transistors in the configurable logic components of device 10 may be configured by a user to implement desired logic functions on programmable logic device 10. For example, the state of a two-input multiplexer may be controlled by programming an associated memory cell to output either a "0" or a "1." If the programming data bit stored in the memory cell is a "0," the memory cell will supply a "0" at its output which will cause the associated transistor circuitry (e.g., transistors such as transistor 20 of FIG. 1) in the multiplexer to connect a first input of the multiplexer to its output. Programming the memory cell so that the memory cell supplies a "1," will direct the multiplexer to connect its second input to its output. Components such as current sources, delay generators, and other circuitry may also be programmably controlled by memory cells.

Figure 2:
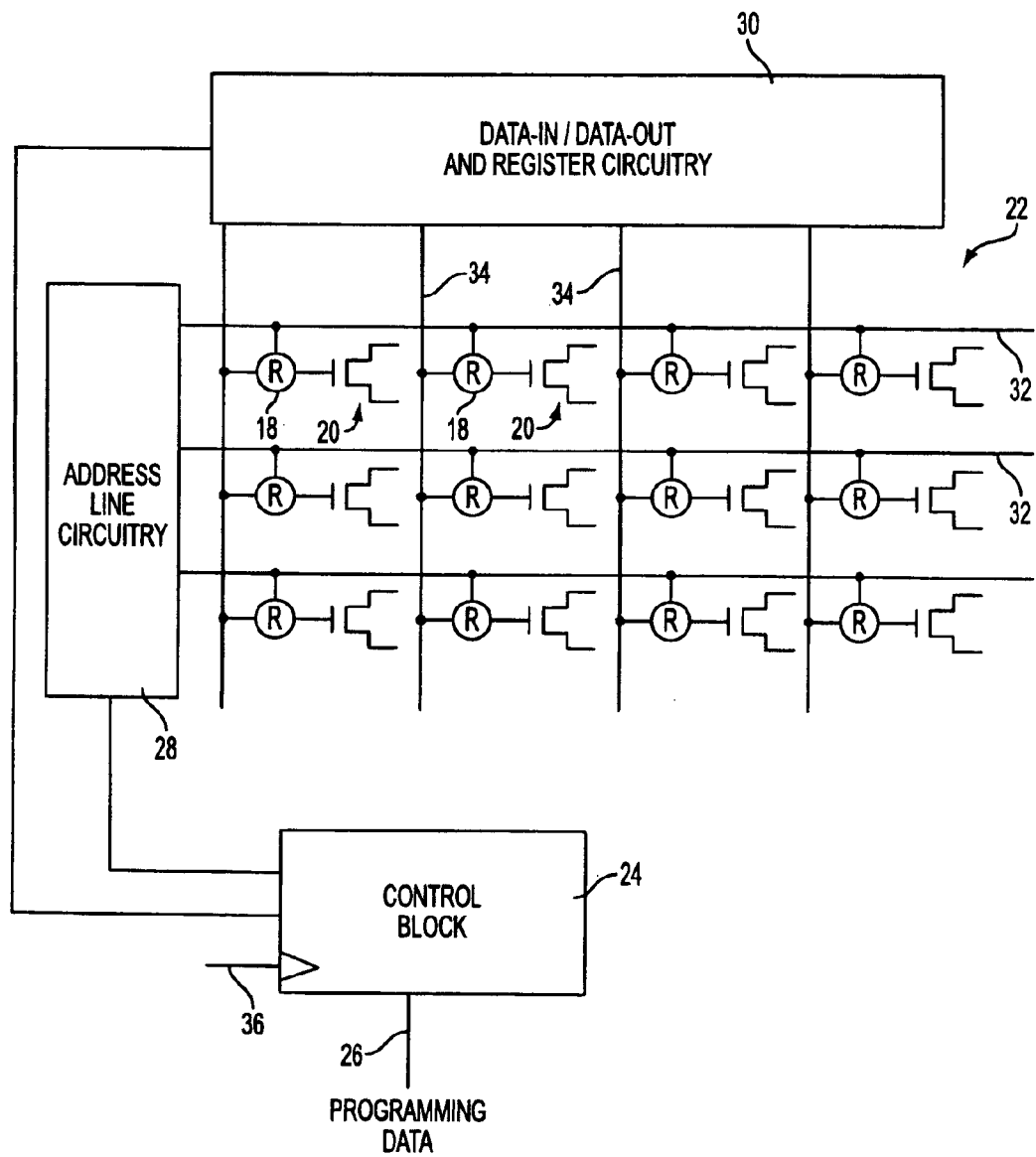
FIG. 2 is a diagram of a portion of an illustrative programmable logic device integrated circuit having circuitry for programming configuration memory cells in accordance with the present invention.

As shown in FIG. 2, some or all of the memory cells 18 in programmable logic device 10 may be arranged in an array 22. There may be any suitable number of rows and columns of memory cells in array 22. For example, there may be 100 or more rows and columns, 200 or more rows, 500 or more rows, 500 or more columns, 1000 or more rows, 1000 or more columns, etc.

Control block circuitry 24 may receive programming data from one or more pins such as pin 26. Control block 24 may be coupled to address line circuitry 28 and data-in/data-out and register circuitry 30 and may use circuitry 28 and 30 to store or program the programming data in the cells 18. Address line circuitry 28 may be used to selectively address the memory cells 18 in a row using an appropriate one of the address lines 32. Typically, all of the memory cells 18 in a given row are addressed at the same time. If desired, the cells 18 on the device 10 may be organized into multiple arrays 22, each of which has address line circuitry 28 for addressing all of the cells in a row on that portion of the device at once (e.g., all 1000 or more cells in that row).

Data-in/data-out and register circuitry 30 is used to support data loading operations in which programming data is conveyed along data lines 34 to cells 18. Data (serial data) is typically shifted into place serially using a shift register in circuitry 30 and is then routed along the data lines 34 in all of the columns of cells in array 22 in parallel at the same time (e.g., to 1000 or more columns of cells in array 22 at once). This process is reversed when it is desired to read out the contents of the loaded memory cells 18 (e.g., to check whether errors have occurred that require array 22 to be reprogrammed). Control block 24 and the other circuitry of FIG. 2 may receive one or more clock input signals at clock inputs such as clock input 36. The clock rate for loading and reading programming data on device 10 may be, for example, 20–40 MHz. The normal operating clock speeds for device 100 during user operation are typically much higher (e.g., 200 MHz and higher).

The serial-to-parallel and parallel-to-serial operations of the shift register circuitry in circuitry 30, the parallel loading/unloading of all of the cells in a row of array 22 (as opposed to reading/writing 16–64 bit words at a time in a memory chip arrangement), and the relatively slower clock speed used by control block 24 all tend to slow down the loading and unloading operations of the circuitry of FIG. 2. However, loading and unloading speed is generally not the most important factor to consider when optimizing the design of programmable logic device 10, because these operations are not performed frequently.

It is desirable to make the programmable memory cells in programmable logic device stable, so that the operation of programmable logic device 10 is stable. Radiation-induced effects are a potential source of memory cell instability. When a memory cell is subjected to strikes from alpha particles, cosmic rays, and other sources of radiation, free charge can be generated in sensitive areas of the transistors that make up the cell. This can lead to undesired charge build-ups and therefore undesired changes in the voltages on the nodes of the memory cell. If the changes in the node voltages are too large, the state of the memory cell can flip unexpectedly.

Figure 3:
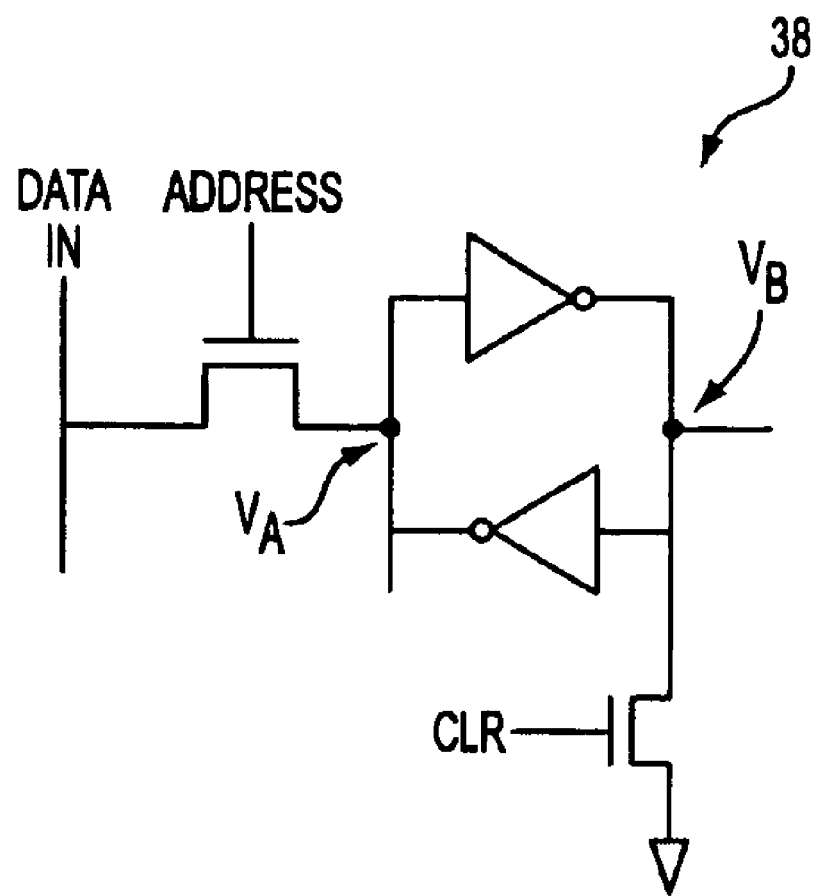
FIG. 3 is a diagram of a conventional programmable logic device configuration memory cell showing the voltages of the input and output terminals of the cell.

A prior art memory cell 38 based on a cross-coupled inverter structure is shown in FIG. 3. Programming data may be supplied to the input of cell 38 by data and address lines. A clear line (CLR) is used to clear the contents of the cell prior to programming. The voltage at the cell input is $V_A$. The voltage at the cell output is $V_B$. During operation, $V_A$ and $V_B$ are opposite to each other (e.g., one is high while the other is low) and must remain relatively constant to avoid causing the state of the cross-coupled inverters to flip. If either $V_A$ or $V_B$ deviates too much from its steady-state value, the output of the inverter that is fed by that voltage may toggle, thereby changing the bit of programming data stored in cell 38.

Figure 4:
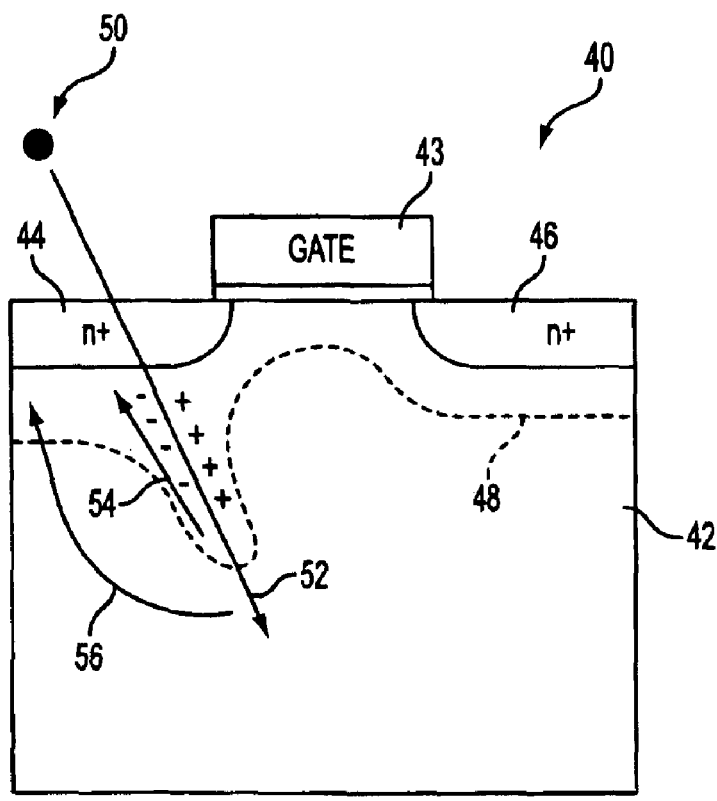
FIG. 4 is a cross-section of a conventional MOS transistor showing how charge is produced during an alpha particle strike.

The effects of an illustrative alpha particle strike on a MOS transistor 40 (such as one of the transistors in cell 38) is shown in FIG. 4. Transistor 40 is formed on a silicon substrate 42. Transistor operation is controlled by the voltage on gate terminal 43. The source and drain diffusions for the source and drain terminals of the transistor are shown as regions 44 and 46. The boundary of the depletion region for this illustrative transistor is shown by dotted line 48.

Figure 5:
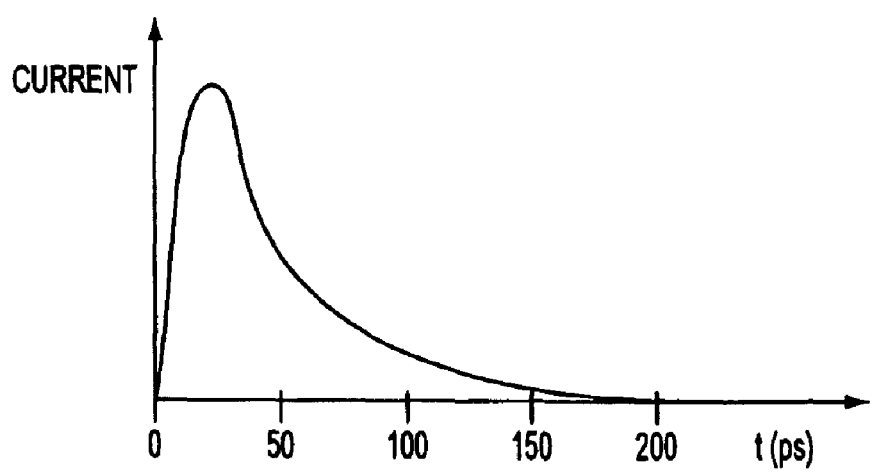
FIG. 5 is a graph showing how current associated with the charge produced by the alpha particle strike of FIG. 4 may evolve as a function of time.

When an alpha particle 50 strikes transistor 40, electron-hole pairs are generated, as represented by the – and + signs adjacent to the particle's path 52. Arrow 54 shows how some of the electrons may be collected at a terminal 44 due to electric-field-induced drift. Arrow 56 shows how other electrons may be collected at terminal 44 due to carrier diffusion. The current (e.g., the charge per unit time that gathers at a transistor terminal such as terminal 44) that results from an illustrative alpha-particle strike is shown in FIG. 5 as a function of time following the strike event. The area under the curve of FIG. 5 represents the total charge collected on the transistor's terminal. If too much charge is collected, the voltage on that terminal (e.g., voltage $V_A$ or $V_B$ in the configuration of FIG. 3) will change so much that it causes the memory cell's state to flip. Errors in the states of cells 18 due to radiation may be referred to as "soft errors." It is generally desired to make the soft error rate of device 10 as low as possible, without overly compromising device performance.

Figure 6:
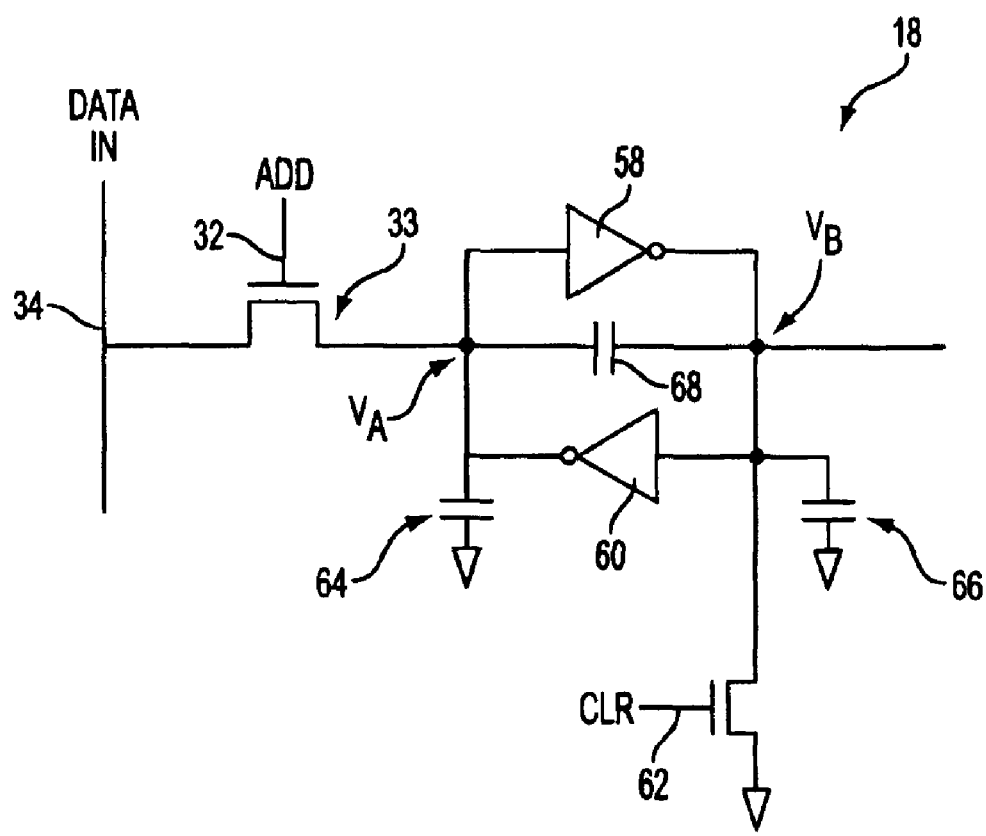
FIG. 6 is a diagram of illustrative configuration memory cell having stabilizing added capacitance in accordance with the present invention.

To prevent undesired changes in the programming data stored in memory cells 18, the memory cells 18 may be stabilized. An illustrative memory cell with stabilization features is shown in FIG. 6. Cell 18 may be programmed by supplying programming data to its input via data line 34 and address line 32 (used to control a corresponding address-line gating transistor 33). A clear line 62 is used to clear cell 18 (and the other cells of array 22) prior to loading cell 18 with programming data.

One way in which to stabilize the operation of cell 18 is to strengthen the transistors in the cell. As shown in FIG. 6, cell 18 may also be stabilized by providing cell 18 with supplemental capacitors such as capacitors 64, 66, and 68. These capacitors, which may have values in the femto-Farad range, serve as voltage buffers in the event that a radiation strike to an adjacent transistor starts to cause a buildup of charge. Capacitor 64, which is connected between the input of cell 18 and ground, helps to maintain the voltage $V_A$ constant. Capacitor 66, which is connected between the output of cell 18 and ground, helps to maintain the voltage $V_B$ constant. Either of these capacitors can be provided or both may be provided. Moreover, either or both of capacitors 64 and 66 may be provided in combination with capacitor 68, or capacitors 64 and 66 can be omitted and capacitor 68 used alone. Use of capacitor 68 alone may often be preferred, because capacitor 68 is more efficient at stabilizing cell 18 for a given value of capacitance than capacitors 64 or 66.

This enhanced efficiency is due to the relative voltage changes experienced on the input and output nodes of memory cell 18. When the voltage $V_A$ is perturbed in the upwards direction, the voltage $V_B$ drops accordingly due to coupling or feedback through the transistors of inverters 58 and 60. As a result, the voltage at one end of capacitor 68 generally is driven in the opposite direction to the voltage at the other end of capacitor 68. This leads to an enhancement effect whereby the effective capacitance of capacitor 68 is increased by a factor of 2. This effect may be referred to as the "Miller effect."

Figure 7:
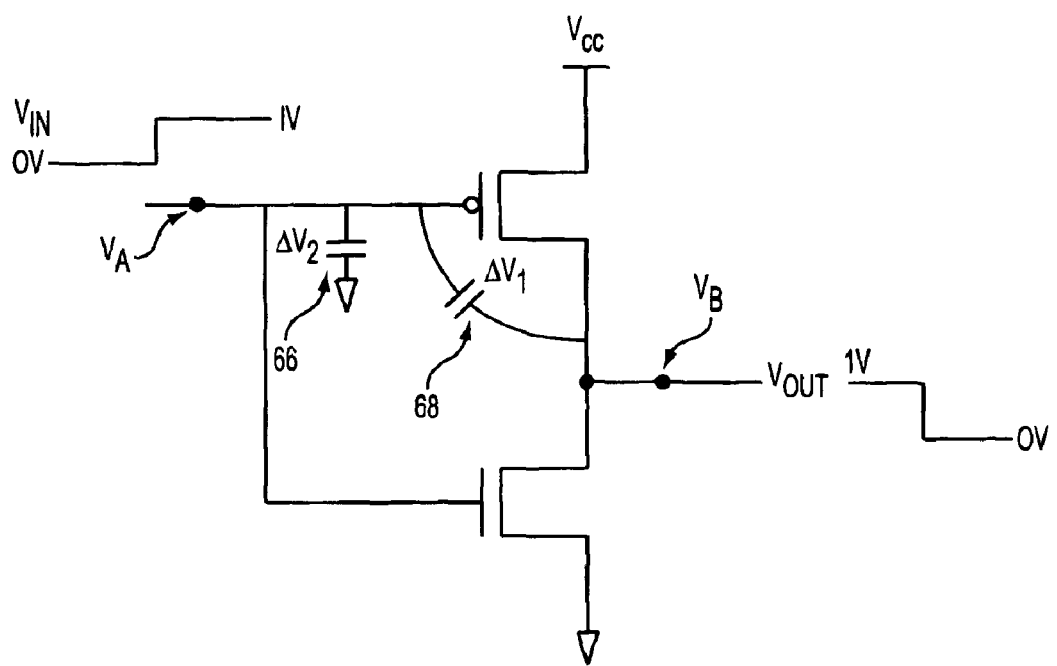
FIG. 7 is a circuit diagram of an inverter with added capacitance at the inverter input and across one of the inverter's transistors.

The Miller-effect enhancement of the effective capacitance of capacitor 68 relative to capacitors such as capacitors 64 and 66 can be understood with reference to FIG. 7. In the example of FIG. 7, the input voltage $V_{IN}$ to the inverter transistors of cell 18 is a step function (e.g., rising from a voltage of 0 V to a voltage of 1 V, as shown by the inset adjacent to the input of the inverter of FIG. 7). This causes the output voltage $V_{OUT}$ to fall from 1 V to 0 V as shown by the inset adjacent to the output of the inverter of FIG. 7. Because the rise in the input voltage in the inverter circuit of FIG. 7 ($\Delta V=1V$) is accompanied by a corresponding fall in the output voltage ($\Delta V=-1V$), the net voltage change for a given value of buffered current is effectively doubled for a capacitor in the position of capacitor 68 relative to a capacitor in the position of capacitor 64.

The multiplication of the apparent efficiency or strength of capacitor 68 relative to capacitor 64 may be further understood from equations 1 and 2.

$$i = dQ/dt \quad (1)$$

$$Q = CV \quad (2)$$

In equation 1, the current i represents the amount of current that a capacitor sinks or sources during a radiation strike (e.g., due to collected charge from an alpha particle strike). The larger the capacitance C, the more current can be sourced or sunk and the greater the voltage buffering power of the capacitor. As shown by equation 2, there is a linear relationship between C and V. In circuits in which V (measured across the capacitor) changes more than expected, the effect on Q (and therefore on dQ/dt) is the same as if the capacitance value C were larger and the voltage changed by only the expected amount. Because the inverter circuit of FIG. 7 makes the change in voltage $\Delta V_1$ across capacitor 68 double (2 V) to that of the change in input voltage (1 V), whereas the change in voltage $\Delta V_2$ (1 V) across capacitor 64 is the same as the change of input voltage (1 V), capacitor 68 has an effective capacitance of at least double that of capacitor 64.

Moreover, capacitor 68 serves as a buffer to both voltage $V_A$ at the input node and to voltage $V_B$ at the output node of cell 18, which effectively doubles the efficiency of capacitor 68 a second time. Circuit feedback effects may reduce the real-world efficiency of capacitor 68. Nevertheless, capacitor 68 has the potential to be as much as four times as efficient as capacitors 64 and 66 in stabilizing cell 18 due to the placement of capacitor 68 in the circuit.

Figure 8:
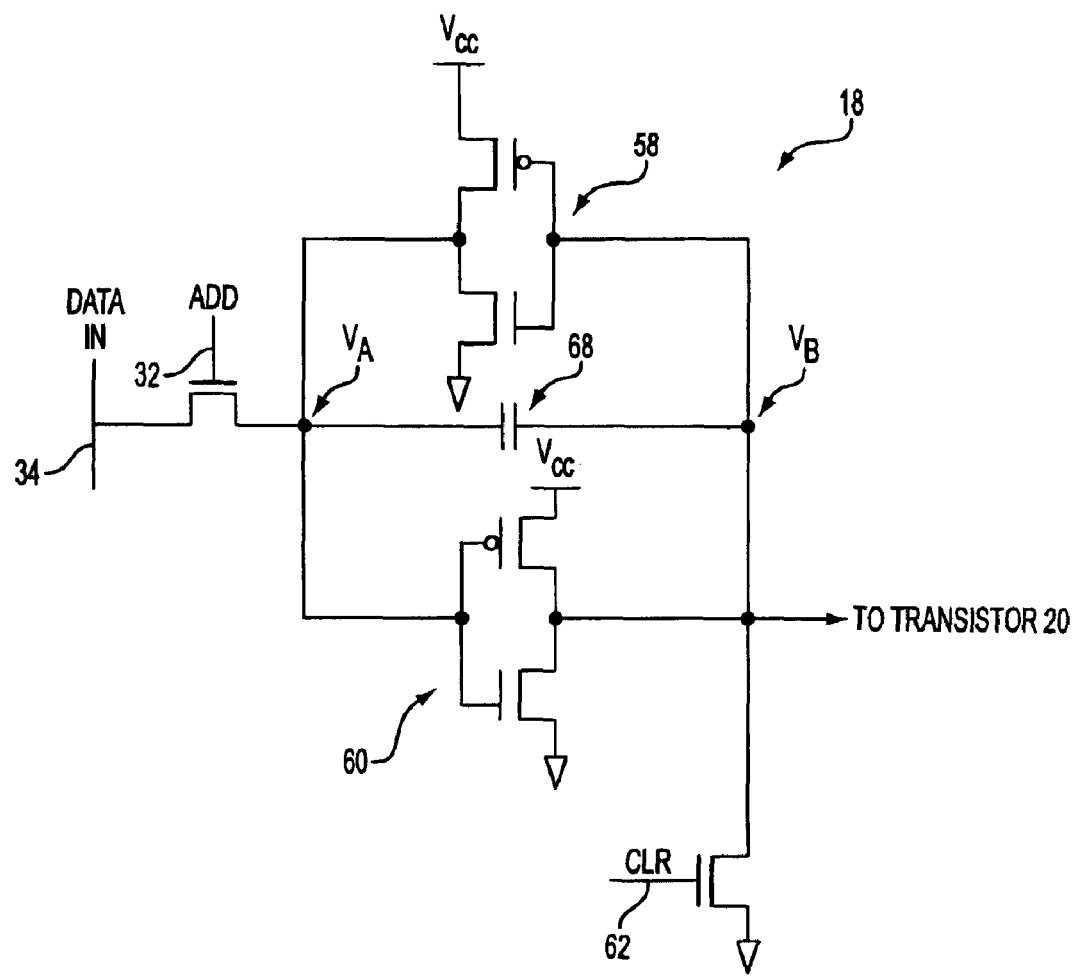
FIG. 8 is a circuit diagram of an illustrative stabilized configuration memory cell in accordance with the present invention.

An illustrative memory cell 18 in which capacitor 68 is used to stabilize the cell is shown in FIG. 8. The cell 18 is relatively more stable than cells of the same design that do not include capacitor 68, because capacitor 68 serves as a voltage buffer in the event that charge is collected at one of the terminals of a transistor in inverters 58 or 60 following a radiation strike. A programmable logic device 10 or other integrated circuit having cells 18 of the type shown in FIG. 8 will therefore exhibit a lower soft error rate than would otherwise be possible.

Figure 9:
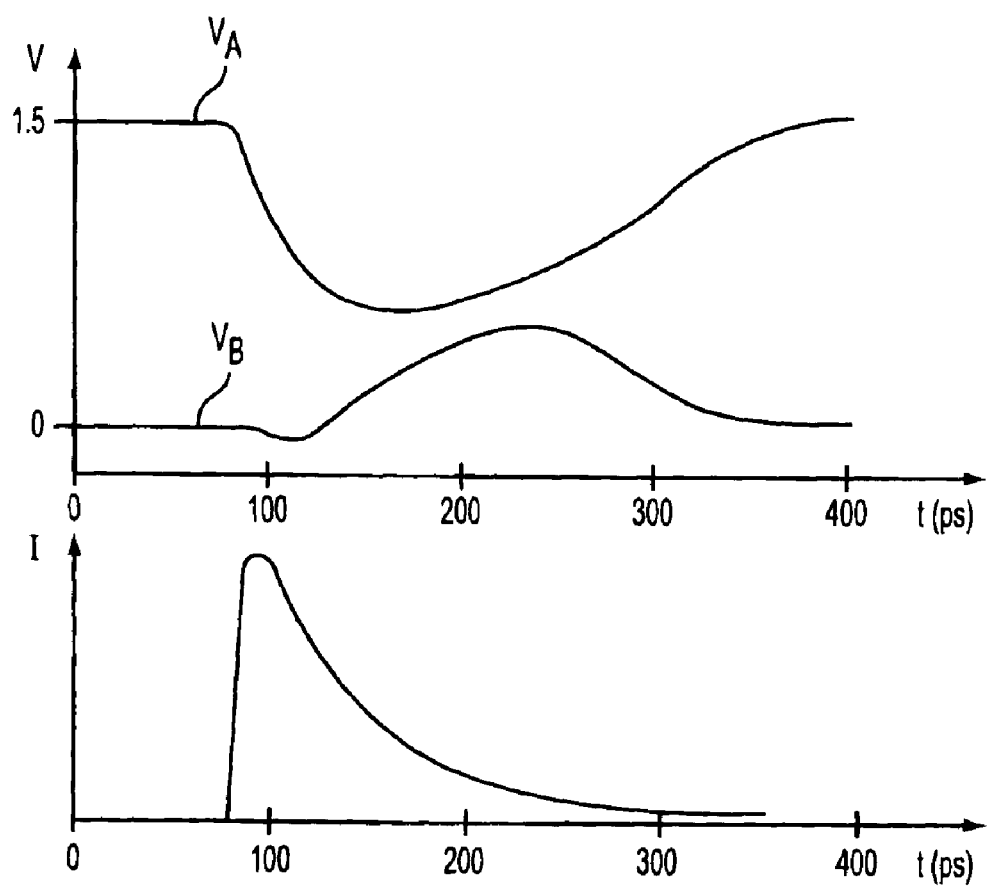
FIG. 9 is a graph showing how the voltages on the input and output of the stabilized configuration memory cell of FIG. 8 behave in response to receiving an alpha particle strike in accordance with the present invention.

The upper trace of FIG. 9 shows the calculated voltage perturbations to the voltages $V_A$ and $V_B$ at the input and output terminals of the cell 18 of FIG. 8 when an inverter transistor in cell 18 is subjected to a radiation strike producing a current profile of the type shown in the lower trace of FIG. 9. Although the voltage traces on the input and output nodes come close to each other, they remain separated, thereby illustrating how the state of the cell 18 is preserved due to the stabilizing effects of capacitor 68. Calculations indicate that the state of the same cell without the stabilizing capacitor 68 would have been disrupted by a radiation strike of the same size.

The stabilizing capacitors such as capacitors 64, 66, and 68 may be formed by enhancing the overlap of certain transistor elements (e.g., the diffusions which act as capacitor electrodes, the oxide layers, and the conductive layers in these elements). Gate-oxide stabilizing capacitors can be formed with sufficient capacitances (e.g., 1–10 fF or 5–10 fF) to produce a desired amount of cell stabilization. This type of stabilization capacitance is produced by increasing the real estate or size of certain transistor elements, which in turn increases the "collection area" for radiation strikes. Because increased collection area leads to an increased soft error rate (the very problem being addressed by the addition of the stabilizing capacitance), it is generally preferred to form the stabilizing capacitors using capacitor structures that can be implemented without consuming any additional real estate over that consumed using a conventional memory cell design.

A number of suitable capacitor structures may be used to provide the stabilizing capacitance for the memory cell without increasing the real estate consumed by the cell. For example, the stabilizing capacitors may also be fabricated by using metal-insulator-metal (MIM) structures or structures that use doped polysilicon for one or both of the capacitor electrodes. These structures can be formed in some of the layers that lie above the memory cell on the programmable logic device die or substrate.

Figure 10:
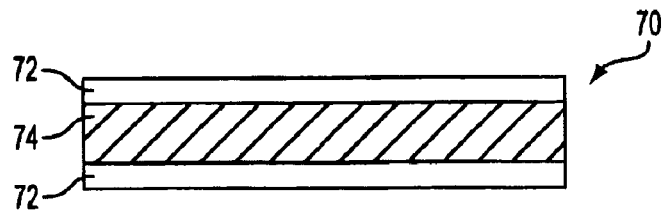
FIG. 10 is a cross-sectional view of an illustrative vertically-formed capacitor with two substantially-planar vertically-opposed electrodes that may be used to stabilize the configuration memory cell of FIG. 8 in accordance with the present invention.

One suitable arrangement for a stabilizing capacitor 70 is shown in FIG. 10. With the approach of FIG. 10, capacitor 70 is formed vertically on the same silicon substrate as the transistors and other components of programmable logic device. A lower electrode layer 72 such as a doped polysilicon layer or a metal layer may be deposited followed by a dielectric layer 74 and an upper electrode layer 72 such as a doped polysilicon layer or a metal layer. The polisilicon or metal layers each lie in a plane parallel to the surface of the silicon substrate on which the programmable logic device 10 is formed. Any suitable materials may be used for forming stabilizing capacitors. For example, metal alloys or metals such as copper, aluminum, or tungsten may be used for the metals. Doped polysilicon or other conductive materials may also be used for the electrodes. Dielectrics such as silicon oxide (e.g., a silicon oxide thermally grown on a polysilicon electrode or a silicon oxide deposited on a polysilicon or metal electrode layer), silicon nitride, spin-on glass, polymers, or other suitable materials may be used as dielectrics.

With the approach of FIG. 10, it is generally desirable to make the dielectric layer thin. The capacitance C scales inversely with thickness, so use of a thin dielectric layer tends to increase the capacitance of the capacitor without increasing the amount of real estate consumed by the capacitor. With one suitable arrangement, the dielectric layer 74 separating the layers of metal 72 may be several hundred to several thousands of Angstroms thick. This compares to the relatively larger oxide thicknesses (thousands of angstroms) used to separate metal interconnect layers and the relatively smaller oxide thicknesses (e.g., 20 angstroms) used as gate oxides on typical devices 10.

Figure 11:
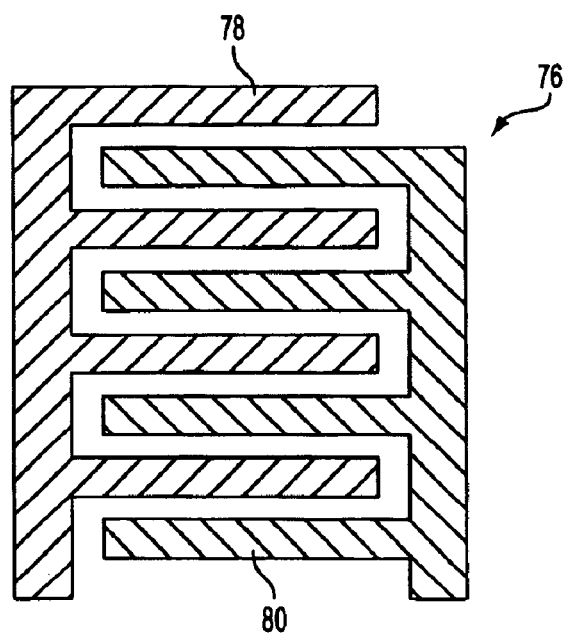
FIG. 11 is a top view of an illustrative horizontally-formed capacitor having electrodes that are horizontally-opposed and that are disposed in a plane parallel to the substrate of the programmable logic device and that may be used to stabilize the configuration memory cell of FIG. 8 in accordance with the present invention.

Another suitable capacitor arrangement that may be used for a stabilizing capacitor is shown in the top view of capacitor 76 in FIG. 11. The capacitor 76 of FIG. 11 has been formed using horizontally-opposing interleaved metal regions that both lie in the same plane. This plane is parallel to the surface of the silicon substrate that is used to form device 10. One metal region has rightwardly-extending metal fingers 78 and the other metal region has leftwardly-extending metal fingers 80 (in the orientation shown in FIG. 11). There are many interleaved fingers in a typical structure and the distance separating the fingers is limited only by the tolerances of the fabrication process, so the total capacitance of horizontal structures of the type shown in FIG. 11 can be high. The arrangement of FIG. 11 is merely illustrative. Any suitable arrangement may be used to form a stabilizing capacitor with horizontally-opposing electrodes. For example, the electrodes may be formed in concentric spirals or other patterns or the electrodes may be formed of other suitable conductive materials such as doped polysilicon.

The stabilizing capacitor 70 of FIG. 10 uses a vertical arrangement, in which each electrode is at a different height with respect to the surface of the silicon substrate used to form the programmable logic device. The stabilizing capacitor 76 of FIG. 11 uses a horizontal arrangement, in which each electrode is at the same height with respect to the surface of the silicon substrate.

Figure 12:
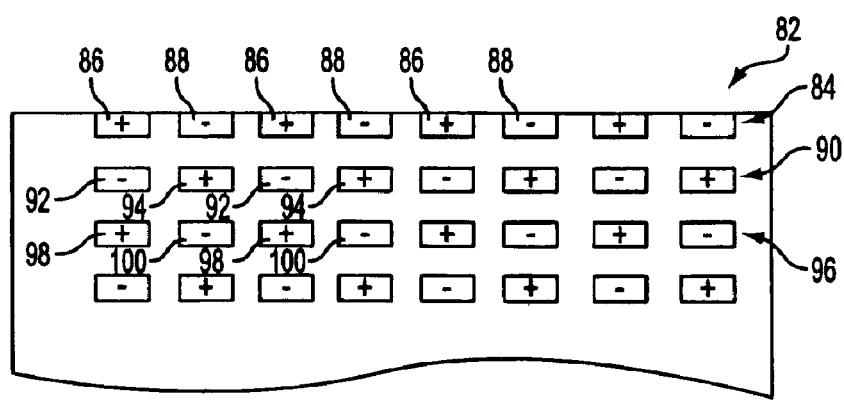
FIG. 12 is a side view showing how both vertical capacitor arrangements (having electrodes arrayed perpendicular to the substrate surface plane) and horizontal capacitor arrangements (having electrodes disposed in a plane parallel to the substrate surface) may be combined in a hybrid capacitor structure for use in stabilizing configuration memory cells of the type shown in FIG. 8 in accordance with the present invention.

If desired, cells 18 may use stabilizing capacitors based on a hybrid structure having both vertically-disposed and horizontally-disposed electrode components. A side view of an illustrative stabilizing MIM capacitor having a hybrid vertical-horizontal structure is shown in FIG. 12. With the capacitor 82 of FIG. 12, there are multiple layers of metal separated by respective dielectric layers. Each layer of metal may have a pair of horizontally-opposing capacitor electrodes, as shown in the arrangement of FIG. 11. For example, metal layer 84 of capacitor 82 may have one set of metal fingers 86 that horizontally opposes another set of metal fingers 88. The metal layer 90 that lies below metal layer 84 may have its own sets of metal fingers such as metal fingers 92 and 94. Similarly, a metal layer 96 may be provided below metal layer 90. Metal layer 96 may have horizontally opposing sets of metal fingers 98 and 100. If desired, some or all of the electrodes may be formed from doped polysilicon or other conductive materials. Additional metal or polysilicon electrode layers may be provided.

To benefit from vertically-derived capacitance as well as horizontally-derived capacitance, the polarity of the electrodes of each layer may alternate. In the cross-sectional diagram of FIG. 12, the alternating polarity of vertically-separated electrode layers is shown by the alternating + and − symbols associated with the fingers. Using vias and other inter-layer conductors (not shown in FIG. 12), the "+" electrodes may all be electrically interconnected with each other and the "−" electrodes may all be electrically interconnected with each other. Capacitance is created between the + and the − electrodes that are horizontally opposed to each other and is created between the + and the − electrodes that are vertically opposed to each other. The effect is cumulative, thereby enhancing the ability of the hybrid structure of FIG. 12 to produce a high capacitance in a small surface area. Accordingly, the stabilizing capacitor structure of FIG. 12 uses real estate efficiently.

Some programmable logic devices may have mixed-signal circuitry. Mixed-signal circuitry handles both analog signals and digital signals on the same device 10. An example of a mixed signal circuit is an analog-to-digital converter circuit. When programmable logic device 10 contains mixed-signal circuitry, it is generally necessary to include high-accuracy mixed-signal capacitors to handle the analog signals. In the illustrative programmable logic device of FIG. 12, the mixed signal circuitry 102 and configurable memory cell circuitry 104 have associated capacitors 106 and 114.

Capacitor 106 may be used for analog applications (e.g., as part of an analog amplifier circuit that is electrically connected to capacitor 106). Capacitor 114 may serve as a stabilizing capacitor such as one of capacitors 64, 66, or 68 of FIG. 6. The capacitors 106 and 114 may be formed from a top layer of metal (e.g., metal layer 8 or M8). Each capacitor may use an arrangement of the type shown in FIG. 10 in which the upper and lower electrodes are vertically opposed.

Figure 13:
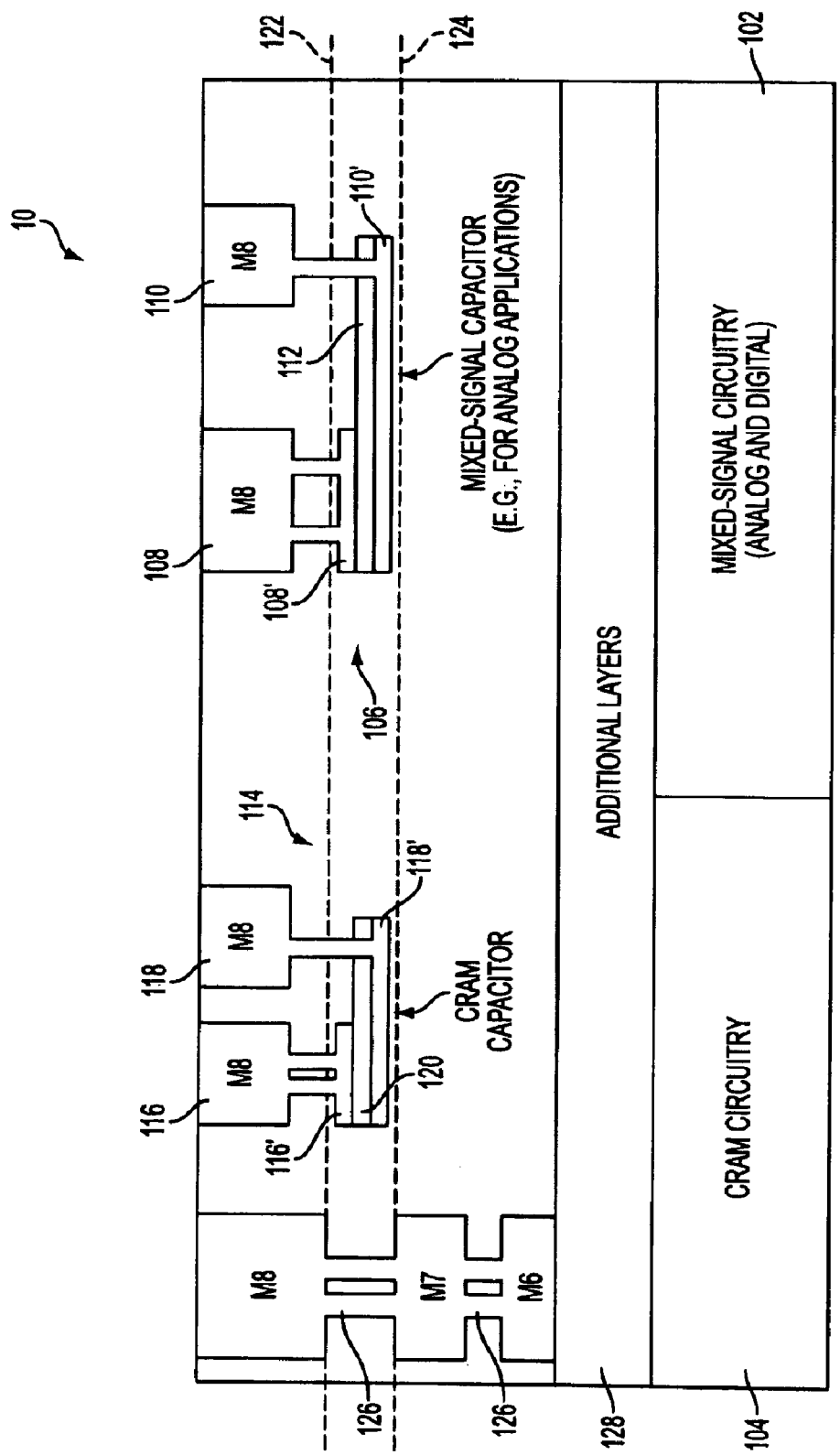
FIG. 13 is a side view of an illustrative programmable logic device having capacitor-stabilized configuration memory cells and having mixed-signal circuits that use capacitors formed from the same material layers as the configuration memory cell capacitors in accordance with the present invention.

With the arrangement of FIG. 13, the upper electrode layer 116' of capacitor 114 and the upper electrode layer 108' of capacitor 106 may be formed during the same metal deposition step during device fabrication. Similarly, the lower electrode layer 118' of capacitor 114 and the lower electrode layer 110' of capacitor 106 may be formed during the same metal deposition step. The upper and lower electrodes of capacitors such analog-circuitry capacitor 106 and memory cell capacitor 114 may be separated by dielectric layers 120 and 112 that are formed during the same dielectric layer deposition step.

The capacitors 106 and 114 may be formed within the space normally provided for the dielectric isolation between metal layer 8 (M8) and metal layer 7 (M7) (i.e., within the dielectric layer that separates the uppermost metal layer (M8) from the next-to-uppermost metal layer (M7). In the side view of FIG. 13, the upper and lower boundaries of this dielectric isolation layer are denoted by dotted lines 122 and 124.

Analog circuit considerations often dictate that analog capacitors be formed in an upper metal layer (e.g., M8) on device 10. With the arrangement of FIG. 13, the stabilizing capacitor 114 can be formed at the same time that the analog capacitors such as capacitor 106 are formed. Vias such as vias 126 and similar vias through additional metal and dielectric layers 128 may be used to electrically connect the stabilizing capacitors 114 to the other circuitry of cells 118.

If desired, the stabilizing capacitors (using any of the arrangement of FIGS. 10, 11, and 12) may be formed in a lower layer (e.g., lower than metal layer 7, lower than metal layer 6, lower than metal layer 5, lower than metal layer 4, lower than metal layer 3, lower than metal level 2, etc.) An advantage of using such a low layer to form the stabilizing capacitors is that this approach requires fewer vias. Vias create potential blockages when optimizing the interconnection routing in a metal interconnection layer, so via usage should generally be minimized if possible.

Providing stabilizing capacitance to cells 18 tends to slow down the speed of data writing operations using cells 18. In some applications (e.g., high-speed memory chips), this reduction in the write speed of the cell may not be acceptable. In programmable logic device 10, the write speed of cells 18 is less critical because the write speed of cells 18 affects programming operations but does not affect how rapidly programmable logic device 10 executes logical functions for the user. Moreover, the impact of the increased cell write speed on programming operations is relatively small, particularly when compared to the somewhat time-consuming serial-to-parallel data conversion tasks already involved in programming. If desired, the soft error performance of cell 18 may be enhanced by increasing the strength of the transistors in the cross-coupled inverters (e.g., inverters 58 and 60 of FIGS. 6 and 8). When the strength of these transistors is increased, the drop of $V_A$ (FIG. 9) and the rise of $V_B$ (FIG. 9) are less pronounced, because the transistor's strength increases each inverter's ability to source and sink current as needed to stabilize voltages on the input and output terminals of the cell 18. Transistor strength may be increased by increasing the transistor's W/L ratio, where W is the transistor's gate width and L is the transistor's gate length.

Figure 14:
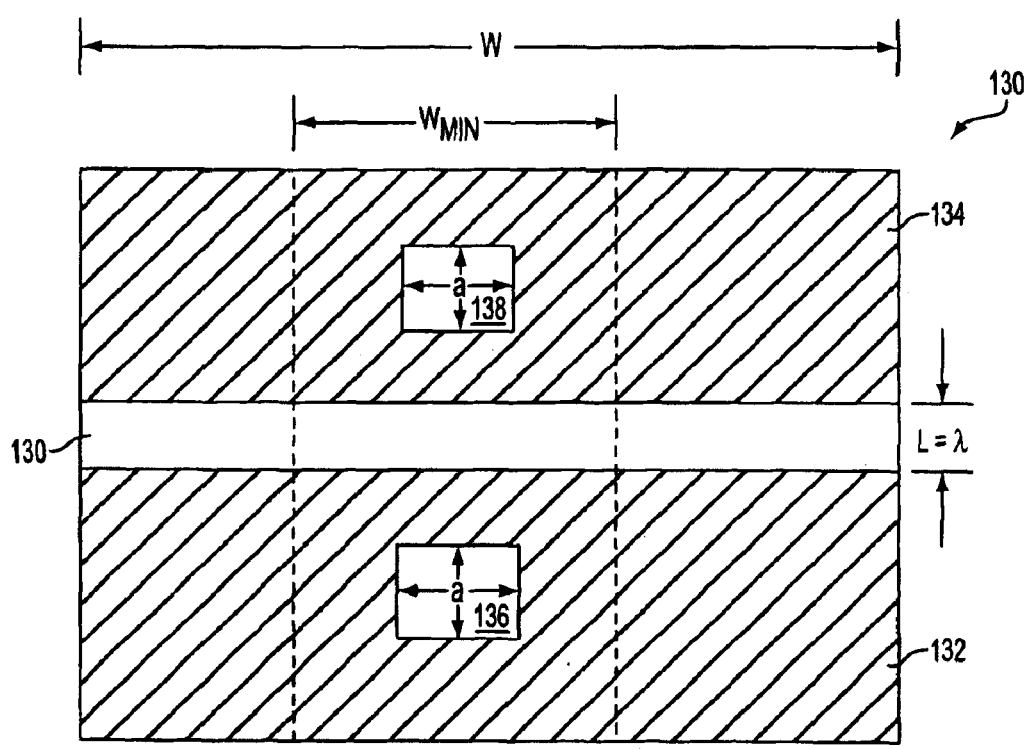
FIG. 14 is a top view of an illustrative MOS transistor layout that may be used to stabilize the configuration memory cell of FIG. 8 in accordance with the present invention.

A top view of the layout of a strengthened inverter transistor 130 for cell 18 is shown in FIG. 14. Memory cell inverter transistors are typically fabricated with gate lengths L equal to the minimum feature size achievable on the device (called λ), as shown for the transistor 130 of FIG. 14. In traditional designs, gate width is also generally minimized to a width of $W_{MIN}$. $W_{MIN}$ is typically greater than λ. For example, $W_{MIN}$ may be equal to about 2–3λ. This provides sufficient tolerance to properly center source and drain contact openings 136 and 138 within source and drain diffusions 132 and 134. (The source and drain contact openings generally have dimensions a=λ and additional gate width is required to ensure that the contact openings are properly aligned with the transistor.)

The strength of the transistor 130 may be enhanced relative to the strength of a conventional programmable logic device's inverter transistors by increasing the gate width W to a value greater than $W_{MIN}$. With this arrangement, the transistors conduct more current in response to a radiation strike, thereby allowing cell 18 to better handle the charge build up associated with the strike without changing the state of the cell. Any suitable gate width W that is greater than the minimum gate width allowed by the fabrication process being used will produce a "strengthened" transistor. As an example, a gate width that is 10% greater or more, 20% greater or more, or 50% greater or more than the value of $W_{MIN}$ may be used.

Another way to mitigate the effects of radiation strikes is to use error detection and correction circuitry on programmable logic device 10. For example control block 24 of FIG. 2 may be configured to periodically read the programming data contents of the memory cell array 22. This information may be compared to previously retained information on the proper memory cell contents. For example, the read-out data and the previously stored data may be compared using the cyclic redundancy check (CRC) technique. If a discrepancy is detected between the CRC value of the read-out configuration data and the CRC value of the previously stored data, the control block may conclude that a soft error has occurred and may therefore proceed to reprogram the memory cells in the array with the correct (retained version) of the programming data. The memory cell contents may be checked periodically (e.g., every 10 ms). Because reprogramming may take about 100 ms, it is desirable to minimize the frequency of reprogramming events by providing stabilizing capacitors such as capacitors 64, 66, and 68 and/or by increasing the strengths of the inverter transistors in addition to providing the error detection and correction capabilities of control block 24.

The foregoing is merely illustrative of the principles of this invention and various modifications can be made by those skilled in the art without departing from the scope and spirit of the invention.

What is claim is:

1. A programmable logic device configuration memory cell on a programmable logic device that receives programming data at a programmable logic device configuration memory cell input terminal and that provides an output signal at a corresponding programmable logic device configuration memory cell output terminal, wherein the output signal is applied to a programmable logic connector on the programmable logic device to configure the programmable logic connector, the programmable logic device configuration memory cell comprising:

a pair of cross-coupled inverters connected between the programmable logic device memory cell input terminal and the programmable logic device memory cell output terminal, wherein the cross-coupled inverters store the programming data; and a stabilizing capacitor connected between the programmable logic device configuration memory cell input terminal and the programmable logic device memory cell output terminal, wherein the stabilizing capacitor has at least two opposing metal electrodes and serves to buffer voltages at the programmable logic device configuration memory cell input terminal and the programmable logic device configuration memory cell output terminal when the memory cell is subjected to a radiation strike.

2. The programmable logic device memory cell defined in claim 1 wherein the cross-coupled inverters and other memory cell circuitry are formed in a silicon substrate on the programmable logic device and wherein the stabilizing capacitor is formed above the cross-coupled inverters and other memory cell circuitry so that the stabilizing capacitor does not cause the memory cell to consume more real estate that would otherwise be consumed by the memory cell.

3. The programmable logic device memory cell defined in claim 1 wherein the stabilizing capacitor has at least two substantially planer electrodes separated by a layer of dielectric.

4. The programmable logic device memory cell defined in claim 1 wherein the cell is formed using a substrate having a substrate surface and wherein the stabilizing capacitor has at least two horizontally-opposed electrodes disposed in a plane parallel to the substrate surface.

5. The programmable logic device memory cell defined in claim 1 wherein the cell is formed using a substrate having a substrate surface, wherein the stabilizing capacitor has at least two electrode layers separated by a dielectric, and wherein at least one of the electrode layers includes first and second horizontally-opposed electrodes in a plane parallel to the substrate surface.

6. The programmable logic device memory cell defined in claim 1 wherein the stabilizing capacitor has at least three electrode layers, each layer including at least two sets of opposing metal fingers.

7. The programmable logic device memory cell defined in claim 1 wherein the stabilizing capacitor has at least three electrode layers, each layer including at least two sets of opposing metal fingers, wherein the fingers in adjacent layers have opposite polarities.

8. The programmable logic device memory cell defined in claim 1 wherein the memory cell is fabricated using a fabrication process that permits transistors of a given minimum value of gate width to gate length ratio to be fabricated, wherein the cross-coupled inverters contain transistors each having a particular gate width to gate length ratio, and wherein at least one of the transistors has been strengthened by providing that transistor with a gate width to gate length ratio that is greater than the given minimum value of gate width to gate length ratio that is permitted by the fabrication process.

9. The programmable logic device memory cell defined in claim 8 wherein the gate width to gate length ratio of the strengthened transistor is at least 20% greater than the given minimum value of gate width to gate length ratio.

10. The programmable logic device memory cell defined in claim 9 wherein the given gate width to gate length ratio is about 3.

11. The programmable logic device memory cell defined in claim 1 wherein the cell is fabricated from a substrate having a substrate surface above which at least six metal layers are formed one after the other, such that the first metal layer is closest to the substrate surface and the sixth metal layer is furthest from the substrate surface, wherein the stabilizing capacitor has capacitor electrodes formed from one of the first four metal layers.

12. A programmable logic device comprising:
   a plurality of memory cells arranged in an array having rows and columns of memory cells, wherein each memory cell has a memory cell input and a memory cell output, a pair of cross-coupled inverters connected between the memory cell input and memory cell output, and a stabilizing capacitor with two terminals respectively connected to the memory cell input and memory cell output, wherein the stabilizing capacitors in the array help to prevent soft errors in the programmable logic device due to radiation strikes;
   address lines connected to the memory cells each of which can address a respective row in the memory cell array;
   data lines connected to the memory cells for conveying programming data to the memory cells;
   address-line circuitry that controls the address lines; and
   register circuitry that receives serial programming data for the memory cells and provides the programming data to the memory cells of the array in parallel on all of the columns in the array at once using the data lines.

13. The programmable logic device defined in claim 12 wherein the array includes at least 200 columns of memory cells and wherein the register circuitry is connected to at least 200 corresponding data lines that are supplied with the programming data in parallel so that at least 200 memory cells in a given row of the array are loaded with programming data at the same time.

14. The programmable logic device defined in claim 12 wherein the stabilizing capacitor in each memory cell comprises at least two metal electrodes.

15. The programmable logic device defined in claim 12 wherein the stabilizing capacitor in each memory cell comprises at least two vertically-opposed metal electrodes.

16. The programmable logic device defined in claim 12 wherein the stabilizing capacitor in each memory cell comprises at least two horizontally-opposed metal electrodes.

17. The programmable logic device defined in claim 12 wherein the stabilizing capacitor in each memory cell has interleaved metal fingers and is formed from at least two metal layers.

18. The programmable logic device defined in claim 12 wherein the stabilizing capacitor in each memory cell has interleaved metal fingers and is formed from at least three metal layers.

19. The programmable logic device defined in claim 12 further comprising a silicon substrate and at least five metal layers formed on the silicon substrate, wherein the layers nearest the silicon substrate are lower layers and the layers farthest from the silicon substrate are upper layers, wherein the stabilizing capacitor in each memory cell is formed from at least one of the four lowest metal layers.

20. The programmable logic device defined in claim 12 further comprising a silicon substrate and a plurality of metal layers disposed on the silicon substrate separated by respective dielectric layers, wherein the layers nearest the silicon substrate are lower layers and the layers farthest from the silicon substrate are upper layers, wherein the stabilizing capacitor in each memory cell is formed within the dielectric layer that separates the uppermost metal layer from the next-to-uppermost metal layer.

21. The programmable logic device defined in claim 12 further comprising:
   analog circuitry; and
   analog capacitors coupled to the analog circuitry, wherein the analog capacitors are formed using at least one layer of metal, wherein the stabilizing capacitors are formed using the same metal layer as that used in the analog capacitors.

22. The programmable logic device defined in claim 12 wherein the stabilizing capacitor comprises at least one capacitor electrode formed from doped polysilicon.

* * * * *